(12) United States Patent
Park

(10) Patent No.: US 6,983,537 B2
(45) Date of Patent: Jan. 10, 2006

(54) METHOD OF MAKING A PLASTIC PACKAGE WITH AN AIR CAVITY

(75) Inventor: Chan-ik Park, Shiheung (KR)

(73) Assignee: Mediana Electronic Co., Ltd., Chungcheongbuk-Do (KR)

( * ) Notice: Subject to any disclaimer, the term of this patent is extended or adjusted under 35 U.S.C. 154(b) by 91 days.

(21) Appl. No.: 10/333,887

(22) PCT Filed: Jul. 20, 2001

(86) PCT No.: PCT/KR01/01244

§ 371 (c)(1),
(2), (4) Date: Jun. 9, 2003

(87) PCT Pub. No.: WO02/09180

PCT Pub. Date: Jan. 31, 2002

(65) Prior Publication Data

US 2004/0011699 A1    Jan. 22, 2004

(30) Foreign Application Priority Data

Jul. 25, 2000   (KR) ............................... 2000-42755
Oct. 7, 2000    (KR) ............................... 2000-59051

(51) Int. Cl.
*H05K 3/34*    (2006.01)

(52) U.S. Cl. .......................... 29/840; 29/827; 29/832; 257/778; 257/782; 438/106; 438/108

(58) Field of Classification Search .................. 29/827, 29/832, 840, 883, 564.6, 566.3; 174/52.2, 174/52.3; 257/778, 782; 438/106, 108

See application file for complete search history.

(56) References Cited

U.S. PATENT DOCUMENTS 4,079,511 A  *  3/1978  Grabbe ........................ 29/827

(Continued)

FOREIGN PATENT DOCUMENTS

JP          2178952         7/1990

(Continued)

*Primary Examiner*—Carl J. Arbes
(74) *Attorney, Agent, or Firm*—Fish & Richardson P.C.

(57) ABSTRACT

A plastic package base, an air cavity type plastic package, and their manufacturing methods, which are capable of realizing the advantages of a ceramic package in that it has a compact size, makes less noise, and is highly thermally resistant, are provided. The plastic package base includes: a first lead frame including at least one first unit body comprising a first pad required for chip bonding and first leads acting as internal terminals, arranged around the first pad and spaced a predetermined distance away from the first pad; a second lead frame including at least one second unit body comprising a second pad and second leads acting as external terminals and bonded to the first lead frame so that the second pad and the second leads correspond to the first pad and first leads of the first lead frame; and a plastic body mold-shaped in spaces between the first and second lead frames so that the top surfaces of the first leads, the top surface of the first pad, the bottom surfaces of the second leads, and the bottom surface of the second pad are exposed on the surfaces of the plastic body and the top surface of the plastic body is not higher than the top surfaces of the first leads.

5 Claims, 15 Drawing Sheets

U.S. PATENT DOCUMENTS 4,746,392 A * 5/1988 Hoppe ................... 156/244.12
5,019,892 A * 5/1991 Grabbe ....................... 257/786
5,614,441 A * 3/1997 Hosokawa et al. ........... 29/827
5,801,074 A    9/1998 Kim et al.
6,677,181 B2 * 1/2004 Park et al. .................. 438/112

FOREIGN PATENT DOCUMENTS

KR             0006598         2/2000

* cited by examiner

METHOD OF MAKING A PLASTIC PACKAGE WITH AN AIR CAVITY

TECHNICAL FIELD

The present invention relates to a package for housing a semiconductor chip therein, and more particularly, to a plastic package base, an air cavity type package for housing a semiconductor chip in an air cavity, and their manufacturing methods.

BACKGROUND ART

Packages for housing electrical or electronic devices, such as semiconductor devices are divided into two different types including ceramic packages and plastic packages. Ceramic packages are air cavity type packages generally formed by filling the inside of a package with air so as to prevent the active surfaces of electrical or electronic device chips installed therein from being in contact with the material of the package, but plastic packages are commonly not of air cavity type. The air cavity type ceramic packages are necessary for physically weak devices, the desired functions and characteristics of which may be severely deteriorated due to contact with the material of a package, high frequency devices which are electrically sensitive, surface acoustic wave filter devices, and optical devices and C-MOS image sensor or charge coupled devices, which require a transparent window structure. However, the ceramic packages are relatively expensive and are not fit for mass production in terms of packaging operation efficiency.

Accordingly, there have been various attempts to develop a substitute for the ceramic packages, which is capable of overcoming the disadvantages of the ceramic packages and has advantages of conventional plastic packages such as high productivity and high economical efficiency. As a result of these attempts, and then air cavity type plastic packages have been developed. The development of air cavity plastic packages have been made possible due to the fact that as cutting-edge technologies used only for military purposes have been commonly used in non-military sectors and their reliability standards has been made less strict, a plastic sealing technique required for formation of air cavity type packages has been proposed. Methods for manufacturing air cavity type plastic packages are being rapidly developed in order to meet the demand of mass production with low prices.

In addition to the fundamental difference between the ceramic packages and the conventional plastic packages that the ceramic packages are of air cavity type, the ceramic packages have one more advantageous difference compared to the conventional plastic packages. That is, the ceramic packages can be easily designed to make less noise and dissipate heat generated from operating electrical or electronic devices more effectively. Since air cavity type plastic packages as well as the conventional plastic packages cannot realize the above advantage peculiar to the ceramic packages, the air cavity type plastic packages cannot extensively replace the ceramic packages yet. In other words, it is nearly impossible to design air cavity type plastic packages to function as well as the ceramic packages do using a current air cavity plastic package technique, and even when this is accomplished, the air cavity type plastic packages may not have the advantages peculiar to normal air cavity type plastic packages, such as high productivity and high economical efficiency.

In the case of the conventional plastic package, its plastic body is formed after mounting a semiconductor chip on a lead frame. On the other hand, in the case of the air cavity type plastic package, its plastic body is previously formed on a lead frame and then a semiconductor chip is installed into the plastic body. Thus, when manufacturing the air cavity type plastic packages, the major elements comprising each package, that is, a plastic package base and a cover, must be prepared before packaging a semiconductor chip, in other words, before mounting and wire-bonding a semiconductor chip on a lead frame. Next, a semiconductor chip is mounted on the package base and then the cover is bonded to the plastic package base with an epoxy adhesive, thereby forming an air cavity in which the exit and entry of air can be completely blocked.

In the meantime, according to the kinds of plastic and an adhesive, air cavity type plastic packages are divided into two different types including an air cavity plastic package having a base and a cover which are injection-molded using a thermoplastic resin and are bonded to each other with a B-stage epoxy, and an air cavity plastic package having a base and a cover which are transfer-molded using a thermosetting resin and bonded to each other with an A-stage epoxy. The latter is considered to be better than the former in view of productivity and reliability.

There is a conventional sealing method used to manufacture an air cavity type plastic package, in which covers whose adhesion portions are coated with the B-stage epoxy in a solid form are hardened by arranging the covers on a base through the use of a sophisticated machine, pressing the covers with a predetermined weight, and keeping the covers in a closed oven for a long time. This method takes advantage of the characteristics of the B-stage epoxy that when heated, the B-stage epoxy is liquefied and becomes very sticky at the early stage and then is rapidly hardened after the heating process is over. Even if expanding air in a cavity being gradually sealed with the B-stage epoxy forms a hole in the B-stage epoxy and is exhausted from the cavity, the hole in the B-stage epoxy can re-seal itself because of its characteristic that if heat is applied to the B-stage epoxy, it becomes sticky.

However, the conventional sealing method for forming an air cavity type plastic package has several problems. First, although the B-stage epoxy is expensive, its physical strength or adhesion strength is low, thus reducing the sealing reliability of the B-stage epoxy. Second, forming an air cavity type plastic package following the conventional sealing method is complicated and the operational efficiency is very low because during coating each cover with the B-stage epoxy and hardening the B-stage epoxy, each of the covers must be pressed with a predetermined weight or a predetermined pressure and it takes a long time to harden the B-stage epoxy.

There is another sealing method for forming an air cavity type plastic package using a liquefied A-stage epoxy as an adhesive. The liquefied A-stage epoxy, unlike the B-stage epoxy, does not have a self-curing function, and an air cavity cannot be sealed with the liquefied A-stage epoxy through a typical oven-hardening method. However, the A-stage epoxy is relatively economical and has strong adhesiveness.

The real functions of an air cavity type plastic package can be performed on a package base. In most cases, a metal ground plate acting as a heat plate is attached to the bottom portion of an air cavity type package in order to effectively dissipate heat generated from operating a semiconductor chip, and leads are installed to hang over predetermined surface areas of the metal ground plate and are a predetermined distance apart in order to manufacture the air cavity type package to make less noise.

FIG. 1 is a cross-sectional view illustrating a conventional air cavity type plastic package formed with the use of the A-stage epoxy. Referring to FIG. 1, a package base includes lead frames 12, a plastic body 14 constituting the walls of an air cavity and formed on the lead frames 12, under the lead frames 12, and at the sides of the lead frames 12, and a heat dissipation/radiation plate or a heat sink 10 bonded to the plastic body 14 with an adhesive 16. A chip 18 is installed on the heat plate 10 and is wire-bonded to each of the lead frames 12 with bonding wires 22. A ground line 24 connects the chip 18 and the heat plate 10. A cover 20 is bonded to the plastic body 14 and the lead frames 12 with a liquefied epoxy adhesive 28 over the package base. There is an exhaust port artificially formed through the cover 20. The exhaust port is closed with a stopper 26. Thus, the air cavity type plastic package having an air cavity formed therein around the chip 18 is completed.

The process of sealing the air cavity type plastic package shown in FIG. 1 is as follows. The chip 18 and the bonding wires 22 are bonded to the package base, and then the liquefied epoxy adhesive 28 is put on contact portions between the cover 20 and the package base. Next, the cover 20, the exhaust port of which is not closed with the stopper 26 yet, is placed on the package base. After that, heat is applied to the liquefied epoxy adhesive 28 so as to harden the liquefied epoxy adhesive 28 and fix the cover 20 to the package base with the epoxy adhesive 28. Next, heated air in the air cavity type plastic package is exhausted through the exhaust port for a while, and then the exhaust port is closed with the stopper 26 formed of a liquefied epoxy adhesive. Finally, the air cavity formed in the air cavity type plastic package is completely sealed by hardening the liquefied epoxy adhesive forming the stopper 26.

However, the conventional method for forming an air cavity type plastic package described above has several problems. First, it is difficult to prevent or remove mold flash from being generated during the process of forming the walls of an air cavity of plastic and subsequent process, and thus the whole air cavity type plastic package may be contaminated with the mold flash. Secondly, in inserting the adhesive 16 into a space among the heat plate 10, the lead frames 12 and the plastic body 14 for bonding the heat plate 10 to the plastic body 14, if the amount of the inserted adhesive differs even minutely from a predetermined amount, the sealing ability of the bonding interface between the heat plate 10 and the plastic body 14 may be deteriorated.

Hereinafter, problems with the conventional air cavity type plastic package will be described greater in detail. The most effective way to prevent mold flash from occurring on a lead frame in a molding process is strongly pressing the lead frame with the upper and lower dies of a mold. However, it is impossible to employ this method for preventing occurrence of mold flash during a process for forming the walls of an air cavity. In addition, even though a complicated process for removing mold flash which has already been generated by melting the mold flash with chemicals and removing the mold flash with the use of water pressure is performed, it is difficult to completely remove the mold flash. In order to make a package more compact, the walls of a cavity must be formed as narrow as possible, and the amount of an adhesive used to bond a heat plate to the plastic body must be very small. A liquefied epoxy having a high viscosity and having strong adhesiveness with a metal heat plate is used as the adhesive. It is very difficult to reproducibly apply a fine amount of such a liquefied epoxy to the plastic body. If the amount of the liquefied epoxy applied to the plastic body is slightly excessive, the liquefied epoxy may spread to the effective area of the heat plate and thus it may become difficulty to bond the ground line 24 to the heat plate 10. On the other hand, if the amount of the liquefied epoxy applied to the plastic body is slightly insufficient, the sealing ability between the plastic cavity walls and the metal heat plate may be considerably deteriorated, and thus the quality of the whole plastic package may deteriorate.

In the conventional method for manufacturing an air cavity type plastic package, in order to bond the cover 20 to the package base and close the exhaust port of the cover 20 with the liquefied epoxy, high-priced and sophisticated machines must be used to apply a liquefied epoxy to the package base and the exhaust port of the cover 20. However the production per hour of the conventional method for manufacturing an air cavity type plastic package is very low in terms of the demand of such high-priced machines, and thus it can be said that a considerable amount of investment in a plant and equipment is required. In addition, in order to make the artificial exhaust port of the cover 20, mold dies for the cover 20 must be accurately machined are prone to be rapidly worn out. Through the worn-out portions of the mold dies, a thin resin layer as mold flash may spread over the exhaust port during molding the cover 20 and shut the exhaust port, thereby lowering the productivity.

FIG. 2 is a cross-sectional view illustrating another conventional air cavity type plastic package. Referring to FIG. 2, a package base includes a first lead frame 42 and a second lead frame 40. The first lead frame 42 includes a pad on which a chip 48 will be mounted. The first plastic body 44b mold-shaped with the first lead frame 42, under the first lead frames 42, and at sides of the first lead frame 42 form the walls of an air cavity. A second lead frame 40 including a lead acting as an external terminal and a heat plate is bonded to the bottom surface of the first lead frame 42 with conductive welding flux. Second plastic body 44a is mold-shaped with the first lead frame 42 and the second lead frame 40 to form the package base. The chip 48 is bonded to the central pad of the first lead frame 42 and is wire-bonded to the lead of the first lead frame 42 with bonding wires 52. A cover 50 is bonded to the package base with an adhesive 46. Then, the formation of the air cavity type plastic package, in which an air cavity is formed around the chip 48, is completed.

The air cavity type plastic package is formed by forming inner walls of the air cavity with the first plastic body 44b firstly mold-shaped while pressing the first lead frame 42 with the upper and lower dies of a mold, bonding the second lead frame 40 including a heat plate and a lead to the bottom surface of the first lead frame 42 with conductive welding flux, and then forming the outer walls of the air cavity with the second plastic body 44a secondly mold-shaped. However, since the walls of the air cavity become thick after being subjected to two molding processes for forming the first and second plastic bodies 44b and 44a, the air cavity type plastic package cannot meet the demand of making a package more compact. In addition, the conventional air cavity type plastic package has some more problems in which adhesive strength at the interface between the first plastic body 44b and the second plastic body 44a is very weak, the number of molds increases, and development expenses are considerable.

DISCLOSURE OF THE INVENTION

To solve the above problems, it is a first object of the present invention to provide a plastic package base which is capable of realizing various functional structures introduced by a ceramic package including a compact-sized structure, such as a leadless or bottom lead structure, and a structure making less noise and showing superior thermal performance, using a plastic molding technique and a method for manufacturing the same.

It is a second object of the present invention to provide a plastic package base, which is capable of improving the productivity and considerably reducing the manufacturing cost, and a method for manufacturing the same.

It is a third object of the present invention to provide an air cavity type package having a simple structure without any exhaust port.

It is a fourth object of the present invention to provide a method for manufacturing an air cavity type package through simple processes, which does not have to use an expensive equipment but can ensure high reliability.

Accordingly, to achieve the first, second, and third objects, there is provided a plastic package base including a first lead frame including at least one first unit body comprising a first pad required for chip bonding and first leads acting as internal terminals, arranged around the first pad and spaced a predetermined distance away from the first pad; a second lead frame including at least one second unit body comprising a second pad and second leads acting as external terminals and bonded to the first lead frame so that the second pad and the second leads correspond to the first pad and first leads of the first lead frame, respectively; and a plastic body mold-shaped in spaces between the first and second lead frames so that the top surfaces of the first leads, the top surface of the first pad, the bottom surfaces of the second leads, and the bottom surface of the second pad are exposed on the surfaces of the plastic body and the top surface of the plastic body is not higher than the top surfaces of the first leads.

Preferably, the top surfaces of the first leads and the first pad of the first lead frame are level with the top surface of the plastic body. Preferably, the top surfaces of the first leads of the first lead frame are level with the top surface of the plastic body but are higher than the top surface of the first pad of the first lead frame. Preferably, each of the first leads of the first lead frame has a depressed portion, the depressed portion of each of the first leads is formed in the shape of a step having a lower portion and an upper portion, the lower of each of the first leads is attached to the second leads, and the upper portion of each of the first leads partially overlays the second pad with the plastic body interposed between the raised portion of each of the first leads and the second pad.

To achieve the first, second, and third objects, there is provided a method for manufacturing a plastic package base comprising: preparing a first lead frame including at least one first unit body comprising a first pad required for chip bonding and first leads acting as internal terminals, arranged around the first pad and spaced a predetermined distance away from the first pad; preparing a second lead frame including at least one second unit body comprising a second pad and second leads acting as external terminals and bonded to the first lead frame so that the second pad and the second leads correspond to the first pad and first leads of the first lead frame, respectively; attaching the first and second lead frames to each other so as to make the first leads and first pad of the first lead frame correspond to the second leads and second pad of the second lead frame, respectively; completing an integrated body consisting of the first and second lead frames having predetermined electrical and physical functions which a package must have, by removing unnecessary portions of the first lead frame; and forming a plastic body in empty spaces in the integrated body consisting of the first and second lead frames by a mold-shaping process.

Preferably, the plastic body exposes the top surfaces of the first leads, the top surface of the first pad, the bottom surfaces of the second leads, and the bottom surface of the second pad, and is formed not to protrude over the top surfaces of the first leads.

Preferably, the first lead frame includes a plurality of first unit bodies each comprised of the first leads and the first pad and arranged with section bars for isolating the unit bodies from one another, the first pad of each of the first unit bodies is connected to the section bars or a frame border via a pad connecting portion, and the first leads of each of the first unit bodies are isolated from one another with predetermined spaces formed among the first leads of each of the first unit bodies. In other words, the first pad may be connected to the pad border with connecting portions placed between the first leads so that the opposing surface between the first pad and each of the first leads is enlarged and the first leads are seemingly in gear with the pad. Alternatively, the first leads may be isolated from the first pad 120 like an island and may be fixed to the first pad 120 only with lead connecting portions 112. Alternatively, the central region of each of the first leads may be bent.

The method for manufacturing a plastic package base may further comprise: polishing the top surfaces of the first leads so as to remove mold flash generated in the step of forming the plastic body; plating the surfaces of the first leads exposed on the surface of the plastic body with a material appropriate for wire bonding; wire-bonding a chip onto the first pad so that the chip is electrically connected to the first leads; and bonding a cover to the plastic package base so that an air cavity is formed on the plastic body to which the chip is wire-bonded and the air tight state of the air cavity can be stably maintained.

According to the plastic package base of the present invention, since a molding process is performed on the integrated body comprised of the first and second lead frames, it is possible to simplify a process for manufacturing the plastic package base. In addition, since the plastic body is not formed over the top surfaces of the first leads, it is possible to reduce the probability of mold flash occurrence, and if mold flash occurs, it is possible to easily remove the mold flash through a polishing process.

To achieve the fourth object, there is provided an air cavity type package comprising: a package base including a lead portion and a pad portion; a chip bonded onto the pad portion of the package base and electrically connected to the lead portion of the package base; a cover forming an air cavity with the package base while adhering closely to the package base and including covering walls so as to enable the chip to be installed in the air cavity; and a sealant for hermetically sealing the cover and the package base around the perimeter of the cover.

Preferably, the package base is a ceramic or plastic printed circuit board. According to a preferred embodiment of the present invention, the package base may comprise: a first unit body of a first lead frame including a first pad required for chip bonding and first leads acting as internal terminals, arranged around the first pad and spaced a predetermined distance apart; a second unit body of a second lead frame including a second pad and second leads acting as external leads and bonded to the first lead frame so that the second leads and second pad of the second unit body correspond to the first leads and first pad of the first unit body, respectively; and a plastic body mold-shaped in spaces between the first and second lead frames so that the top surfaces of the first leads, the top surface of the first pad, the bottom surfaces of the second leads, and the bottom surface of the second pad are exposed on the surfaces of the plastic body, and the top surface of the plastic body is not higher than the top surfaces of the first leads.

According to another preferred embodiment of the present invention, each of the first leads may be formed in the shape of a step having a lower portion and an upper portion, the lower of each of the first leads may be attached to the second leads, and the upper portion of each of the first leads partially may overlay the second pad with the plastic body interposed between the raised portion of each of the first leads and the second pad.

To achieve the fourth object, there is provided a method for manufacturing an air cavity type plastic package comprising: preparing a package base including a plurality of unit bodies arranged and each comprised of a pad portion required for chip bonding and a lead portion for electrically connecting a chip to the outside; bonding a chip onto the pad portion of each of the unit bodies; preparing a cover plate including a plurality of individual covers corresponding to the unit bodies of the package base, covering walls underneath each of the individual covers for forming an air cavity with the package base by covering the cavity walls adhere closely to the package base, connecting portions connecting the individual covers to each other and being isolated from the package base by a predetermined distance, and a cover dam formed along the edge of the cover plate for being fit into the package base; fixing the cover plate to the package base so as to make the covering s walls and cover dam of the cover plate protect the chip in each of the unit bodies of the package base; heating the package base to which the cover plate is fixed to a predetermined temperature; inserting a liquefied epoxy sealant into spaces between the cover dam and each of the covering walls except for the air cavity in which the chip is installed, while maintaining the package base at the predetermined temperature, and then hardening the liquefied epoxy sealant; and dividing the package base to which the cover plate is fixed into individual packages by sawing the connecting portions of the package base.

The step of preparing the package base may comprise: preparing a first lead frame including at least one first unit body comprising a first pad required for chip bonding and first leads acting as internal terminals, arranged around the first pad and spaced a predetermined distance away from the first pad; preparing a second lead frame including at least one second unit body comprising a second pad and second leads acting as external terminals and bonded to the first lead frame so that the second pad and the second leads correspond to the first pad and first leads of the first lead frame; attaching the first and second lead frames to each other so as to make the first leads and first pad of the first lead frame correspond to the second leads and second pad of the second lead frame, respectively; completing an integrated body consisting of the first and second lead frames having predetermined electrical and physical functions which a package must have, by removing unnecessary portions of the first lead frame; and forming a plastic body in empty spaces in the integrated body consisting of the first and second lead frames by a mold-shaping process.

In the step of heating the package base to a predetermined temperature, the predetermined temperature may reach as close as possible below the vitrification transition range of the liquefied epoxy resin.

According to the present invention, since a liquefied epoxy is inserted between a package base and a cover preheated to a predetermined temperature, the liquefied epoxy can be hardened under a state where the variation of pressure becomes very sluggish, and thus the package base and the cover can be hermetically sealed.

BRIEF DESCRIPTION OF THE DRAWINGS

The above objects and advantages of the present invention will become more apparent by describing in detail preferred embodiments thereof with reference to the attached drawings in which.

BEST MODE FOR CARRYING OUT THE INVENTION

The present invention will now be described more fully with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art.

<First Embodiment>

Figure 1:
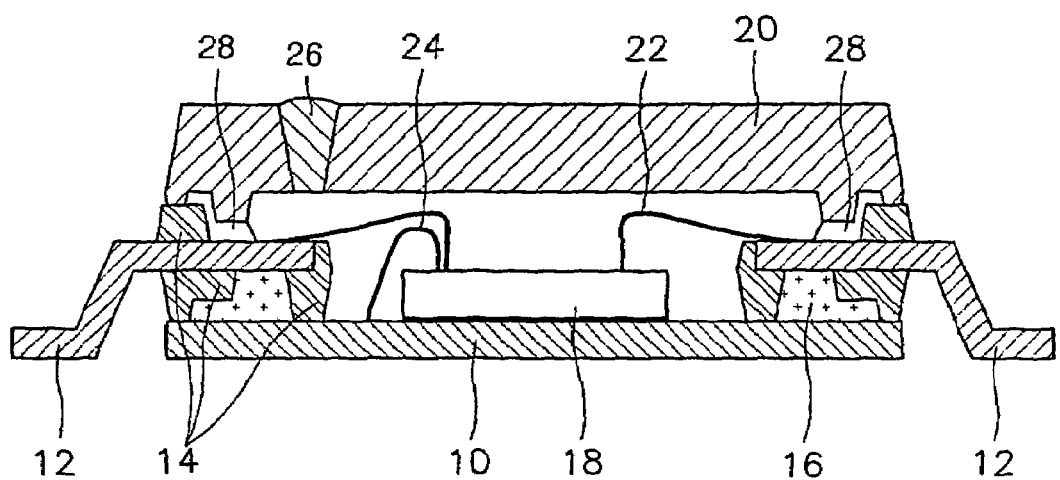
FIG. 1 is a cross-sectional view illustrating a conventional air cavity type plastic package.
Figure 2:
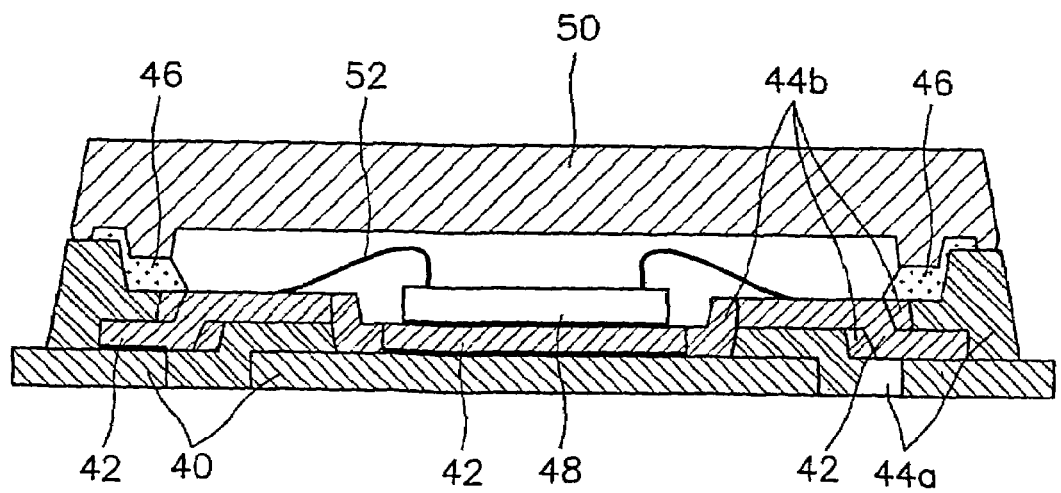
FIG. 2 is a cross-sectional view illustrating another conventional air cavity type plastic package.
Figure 3:
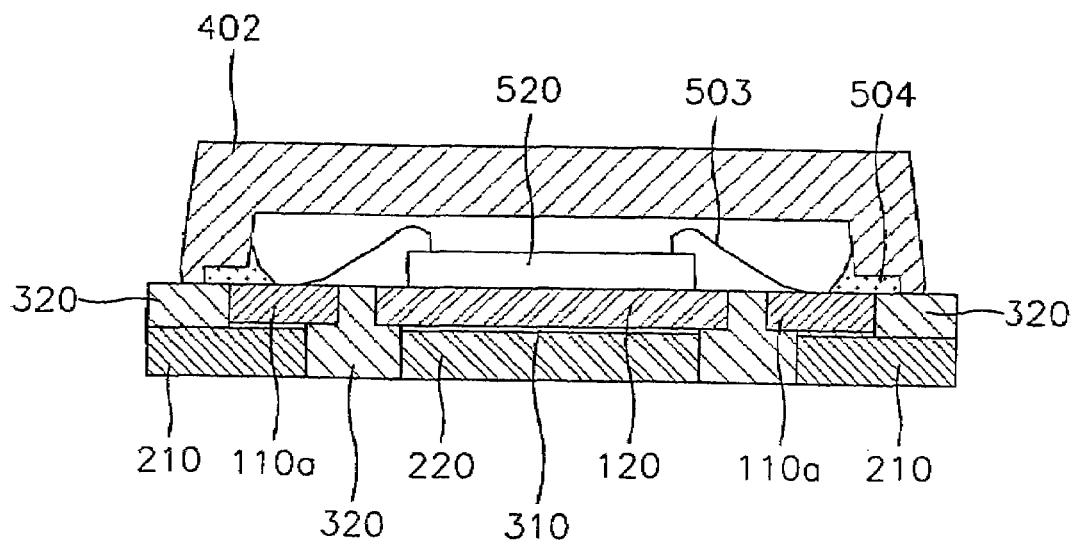
FIGS. 3 through 7 are cross-sectional views illustrating air cavity type plastic packages according to the present invention.

FIG. 3 is a cross-sectional view illustrating an air cavity type plastic package according to a first embodiment of the present invention. Referring to FIG. 3, a first lead frame including a first lead 110a, which acts as an internal terminal, and a first pad 120, and a second lead frame including a second lead 210, which acts as an external terminal, and a second pad 220, are bonded together with conductive welding flux 310. A chip 520 is bonded to the first pad 120 on the first lead frame with an adhesive (not shown) and is wire-bonded to the first lead 110a of the first lead frame with bonding wires 503.

The first and second lead frames are mold-shaped into an integrated body with an epoxy molding compound (EMC) plastic body 320. The top surfaces of the first lead 110a and the first pad 120 and the bottom surfaces of the second lead 210 and the second pad 220 are exposed. The top surface of the plastic body 320 is level with the top surfaces of the first lead 110a and the first pad 120.

A cover 402 is hermetically bonded to the package base including the first and second lead frames coupled together with the plastic body 320 by interposing an epoxy adhesive 504 between the cover 402 and the package base. As a result, formation of the air cavity type plastic package including the base, the cover 402, and an air cavity formed therebetween is completed.

Figure 4:
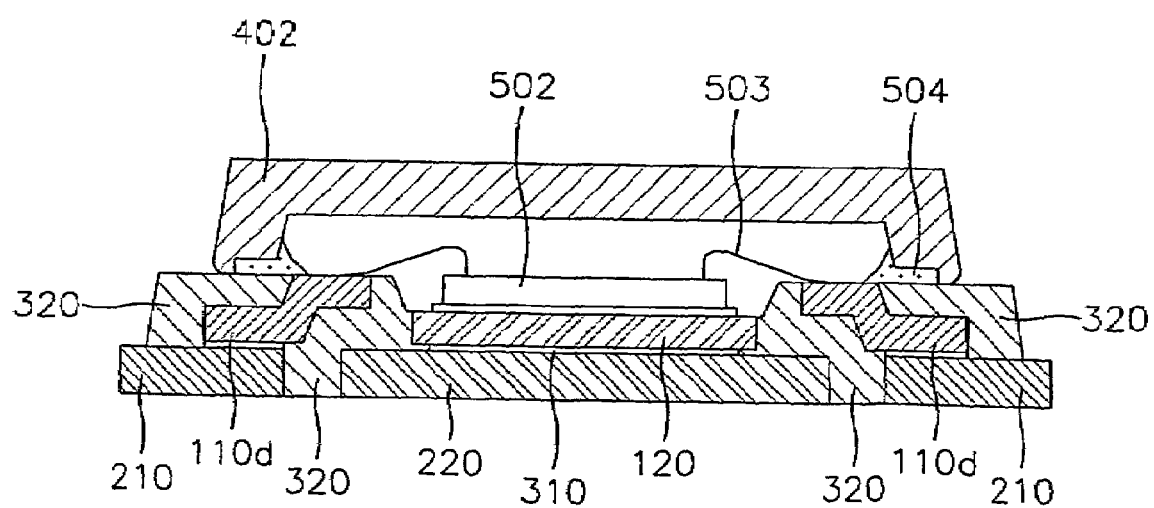

FIG. 4 is a cross-sectional view illustrating another air cavity type 30 plastic package according to an aspect of the first embodiment of the present invention. The same reference numerals in FIGS. 3 and 4 represent the same elements, and thus their description will be not be repeated.

Referring to FIG. 4, predetermined portions of first leads 110d of a first lead frame are bent in the shape of a step, and the top surface of the plastic body 320 is level with the top surfaces of the first leads 110d and is higher than the top surface of the first pad 120. In other words, lower portions of the first leads 110d are bonded to the top surfaces of the second leads 210, and upper portions of the first leads 110d partially overlay the second pad 220 with the plastic body 320 interposed therebetween.

Hereinafter, a plastic package base of an air cavity type plastic package required for electrical or electronic devices according to an aspect of the first embodiment of the present invention, an air cavity type plastic package including the package base according to an aspect of the first embodiment of the present invention, and a method for manufacturing the air cavity type plastic package according to an aspect is of the first embodiment of the present invention will be described.

Figure 8:
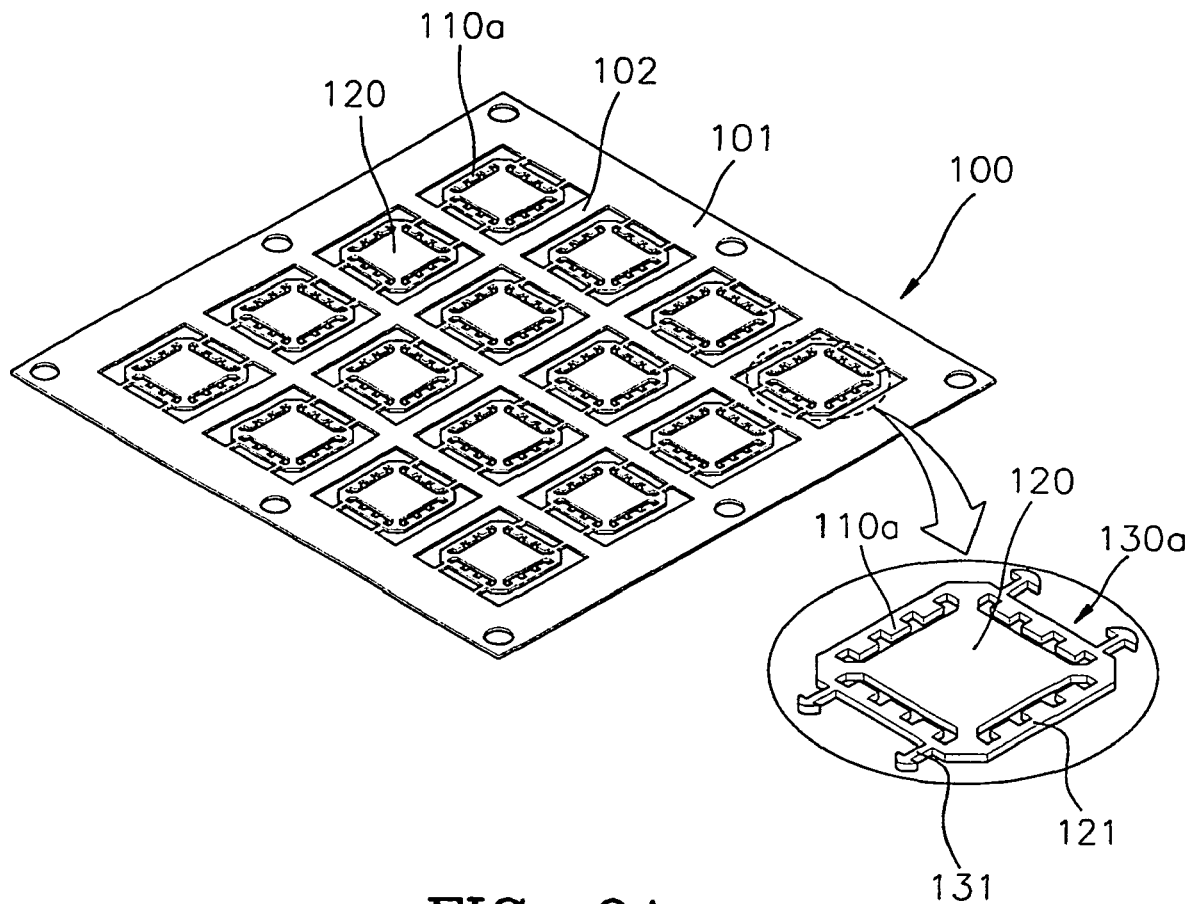
FIG. 8 is a perspective view illustrating a first lead frame according to an aspect of a first embodiment of the present invention.
Figure 9A:
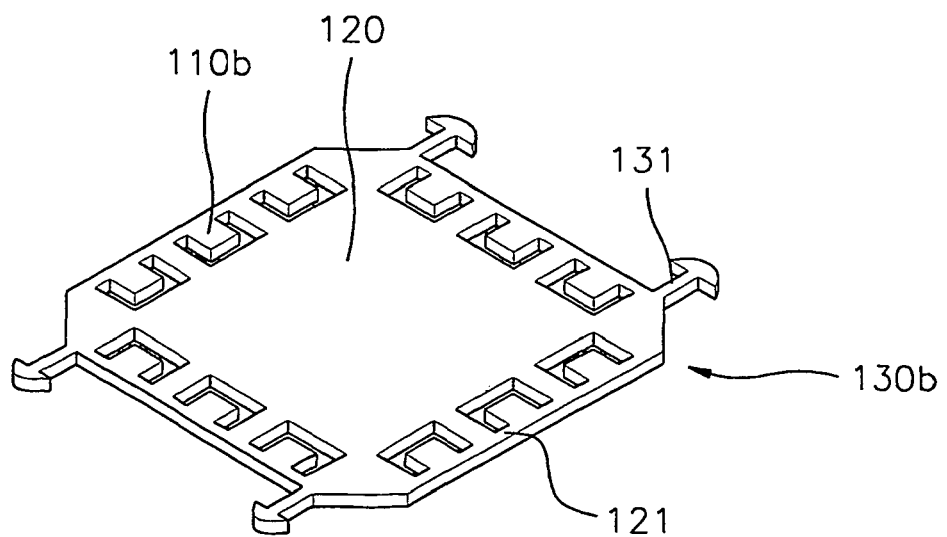
FIGS. 9A, 9B and 10 are perspective views illustrating variations of a unit body of a first lead frame according to an aspect of a first embodiment of the present invention.
Figure 9B:
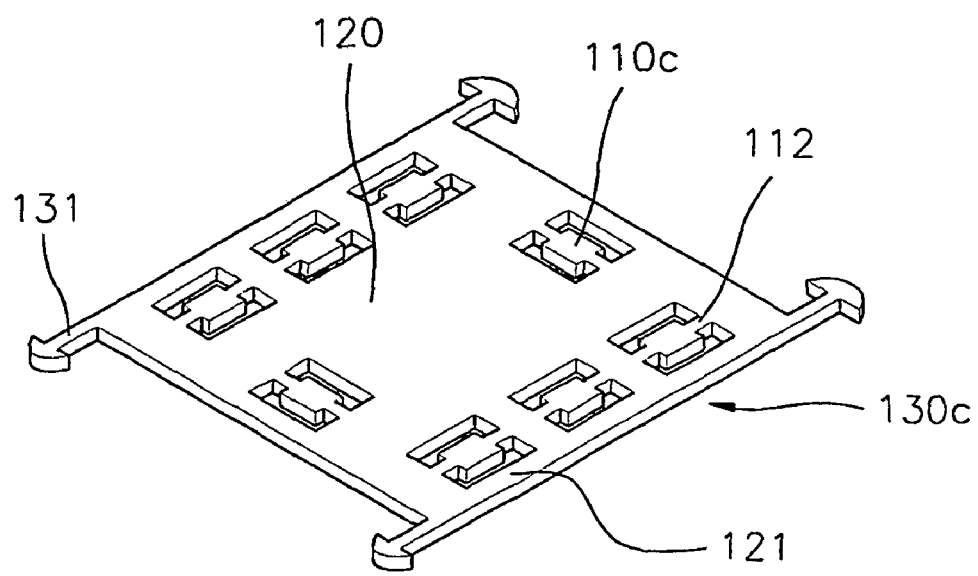
Figure 10:
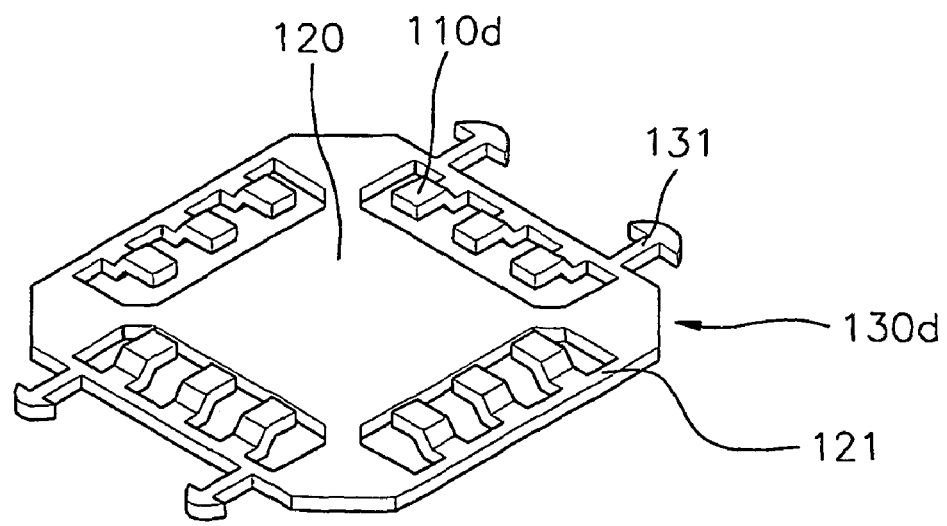
Figure 11:
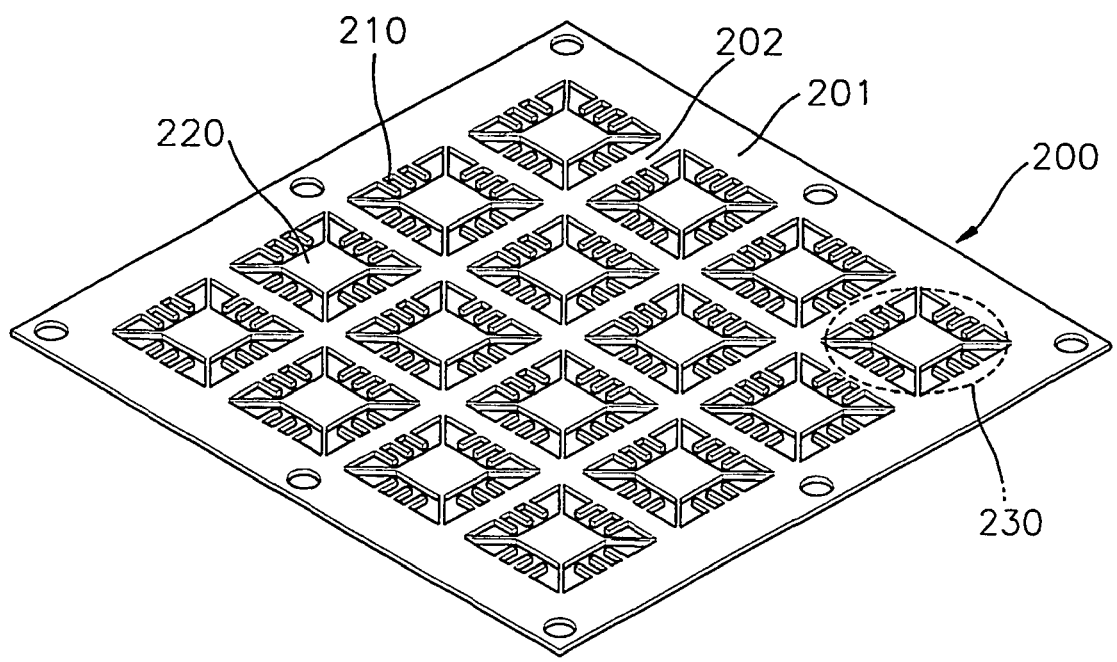
FIG. 11 is a perspective view illustrating a second lead frame according to an aspect of a first embodiment of the present invention.

First and second lead frames, which can overlay each other and can be bonded together, are prepared. FIG. 8 is a perspective view illustrating a first lead frame according to an aspect of the first embodiment of the present invention. FIGS. 9A, 9B and 10 are perspective views illustrating variations of a unit body of a first lead frame according to an aspect of the first embodiment of the present invention. FIG. 11 is a perspective view illustrating a second lead frame prepared to correlate with the first lead frame of FIG. 8.

In a first lead frame 100, as shown in FIG. 8, a plurality of first unit bodies 130a divided by section bars 102 and each including the first leads 110a and the first pad 120 are arranged into a sort of matrix. The first lead frame 100 does not have particular lead portions corresponding to outer leads in conventional lead frames, and the first leads 110a and the first pad 120 in each of the first unit bodies 130a are divided by a predetermined space in a frame border 101. In the enlarged view of one of the first unit bodies 130a, the first leads 110a are placed between the first pad 120 and a pad border 121 and are fixed to the pad border 121 with minimal connecting portions, respectively. Each of the first unit bodies 130a is fixed to the section bars 102 or the frame border 101 of the first lead frame 100 with minimal pad connecting portions 131.

Here, the first unit bodies 130a may be embodied in many different forms. The structure shown in the enlarged view of one of the first unit bodies 130a in FIG. 8, in which the first pad 120 is connected to the pad border formed along the border of the each of the first unit bodies 130a and the first leads 110a, which are connected to the pad border 121 and are saw-toothed, face the edges of the first pad 120 to which a chip will be bonded, is commonly used.

On the other hand, referring to FIG. 9A illustrating another unit body 130b designed to obtain a less-noise effect, the first pad 120 is connected to the pad border 120 with connecting portions placed between first leads 110b so that the opposing surface between the first pad 120 and each of the first leads 110b is enlarged and the first leads 110b are seemingly in gear with the pad 120.

Referring to FIG. 9B illustrating another unit body 130c, each first lead 110c seems to be isolated from the first pad 120 like an island and is fixed to the first pad 120 only with lead connecting portions 112.

As shown in FIG. 10, first leads 110d, unlike the first leads 110a of each of the first unit bodies 130a shown in FIG. 8, have raised portions, and thus the tip of each of the first leads 110d is higher than the surface of the second pad 220. The reason that the first leads 110 are formed to have raised portions is to improve heat dissipation characteristics and obtain a less-noise effect by making a second pad 220, which will be described later with reference to FIG. 11, occupy a larger space and overlay predetermined portions of the first leads 110d. Each of the first leads 110a, 110b, and 110c shown in FIGS. 8, 9A and 9B may also be formed to have a raised portion.

As shown in FIG. 11, in a second lead frame 200, a frame border 201, section bars 202, and a plurality of unit bodies 230 each including second leads 210 and a second pad 220 and isolated from one another by means of the section bars 202 are arranged so that they face the corresponding elements of the first lead frame 100, and opposing surfaces between the second leads 210 and the first leads 110a and between the second pad 220 and the first pad 120 are formed as large as possible. Here, the second lead frame 200 and the first lead frame 100 are not attached to each other but spaced away from each other.

Figure 12:
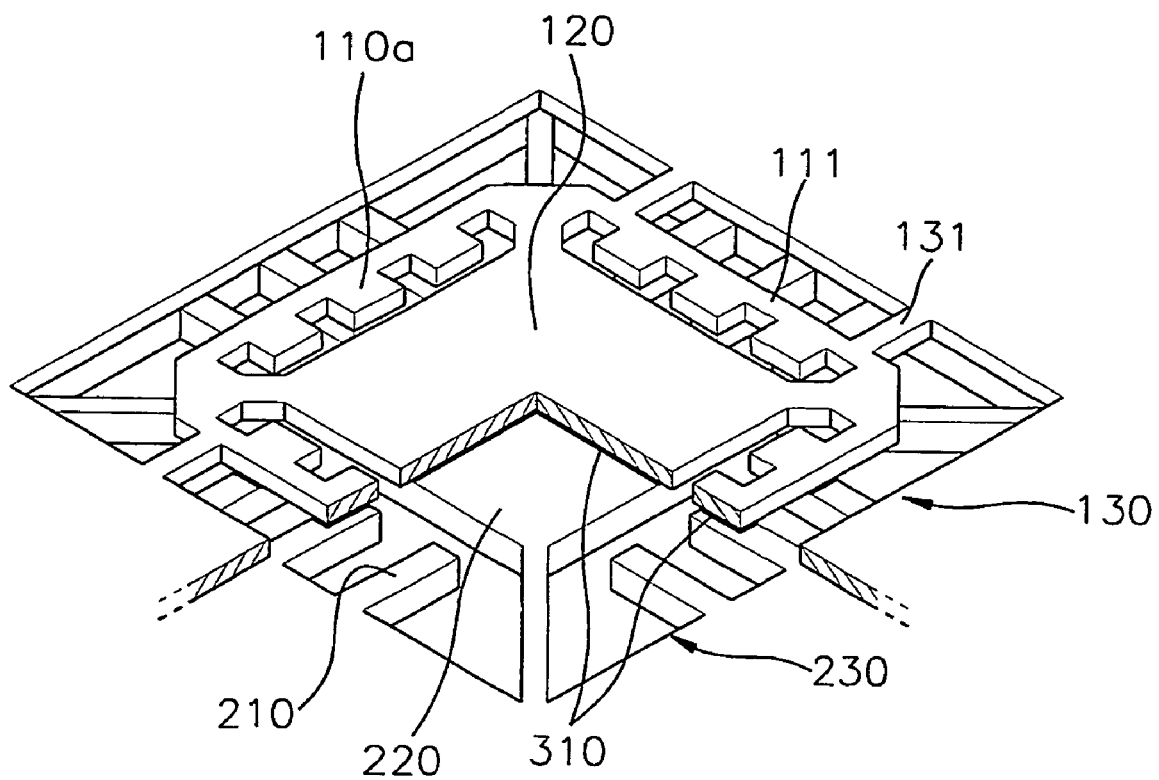
FIG. 12 is a perspective view illustrating an integrated body comprised of first and second lead frames according to an aspect of a first embodiment of the present invention.

The lead frame 100 shown in FIG. 8 and the second lead frame 200 shown in FIG. 11 are attached to each other by means of conductive welding flux 310. FIG. 12 is a perspective view illustrating a first unit body 130 of the first lead frame 100 and a second unit body 230 of the second lead frame 200 coupled together.

Referring to FIG. 12, the first unit body 130 of the first lead frame 100 and the second unit body 230 of the second lead frame 200 are attached to each other by means of the conductive welding flux 310 so that the bottom surface of the first pad 120 and the top surface of the second pad 220 are attached together. Also, the bottom surfaces of the first leads 110a and the top surfaces of the second leads 210 are also attached together so that the first leads 110a and the second leads 210 are closely connected with each other in terms of their electrical and physical functions.

Figure 13:
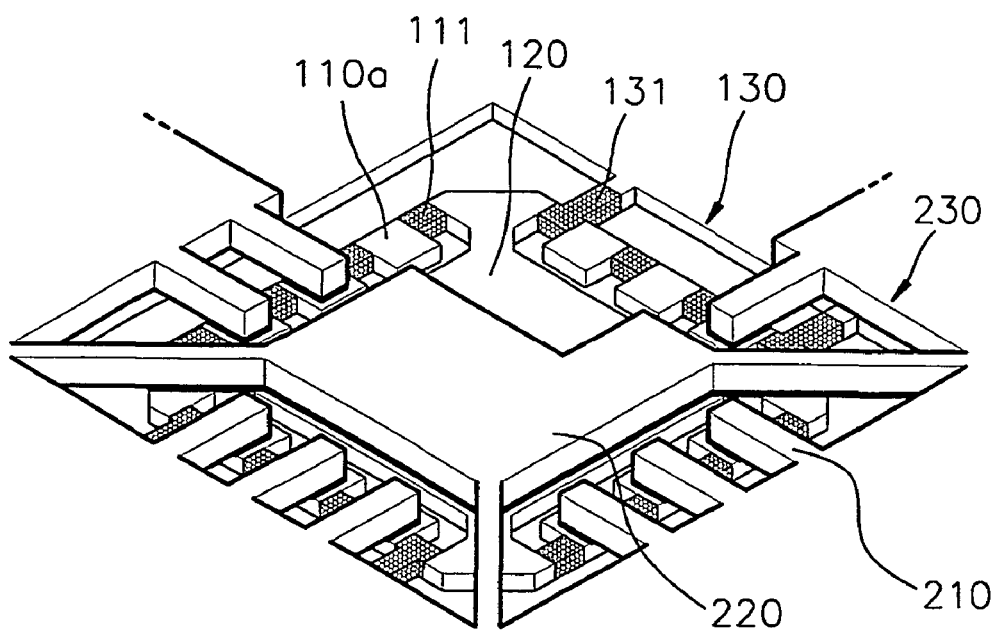
FIG. 13 is a perspective view illustrating the bottom of the integrated body of FIG. 12 comprised of first and second lead frames with parts to be removed through a stamping process.

Next, unnecessary parts are removed from the first lead frame 100 by a stamping process. FIG. 13 is a perspective view illustrating the bottom portions of the first lead frame 100 and the second lead frame 200 coupled together and the unnecessary parts of the first lead frame 100 to be removed by the stamping process. Referring to FIG. 13, all the portions of the first lead frame 100 except for the first pad 120 and the first leads 110a, that is, the pad border 121, the lead connecting portions 111, and the pad connecting portions 131, are removed by the stamping process.

Figure 14:
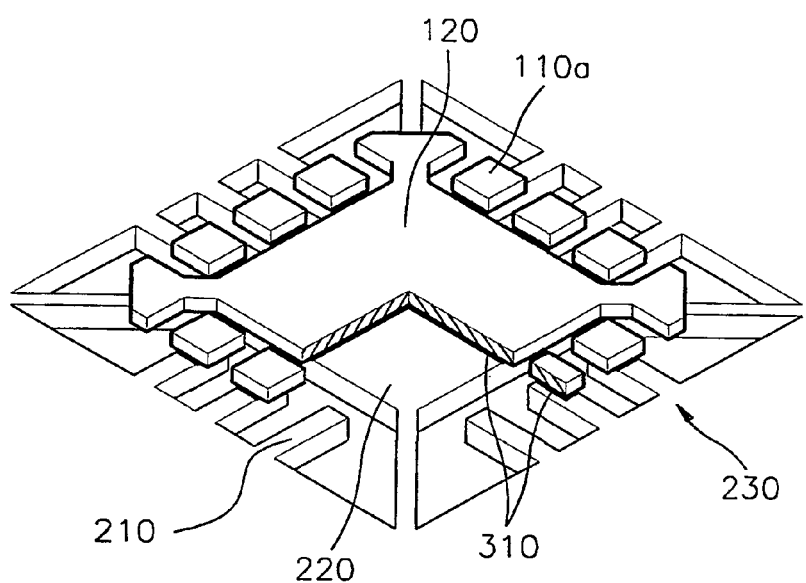
FIG. 14 is a perspective view illustrating a completed integrated body of the first and second frames after removing unnecessary parts from the first lead frame through a stamping process.

As a result, the first and second lead frames 100 and 200 are incorporated into one lead frame integrated body which can realize predetermined electrical and physical functions of a package and can be transfer-molded. FIG. 14 is a perspective view illustrating the completed integrated body of the first and second lead frames 100 and 200 after removing the unnecessary portions of the first lead frame 100 by the stamping process.

Figure 15:
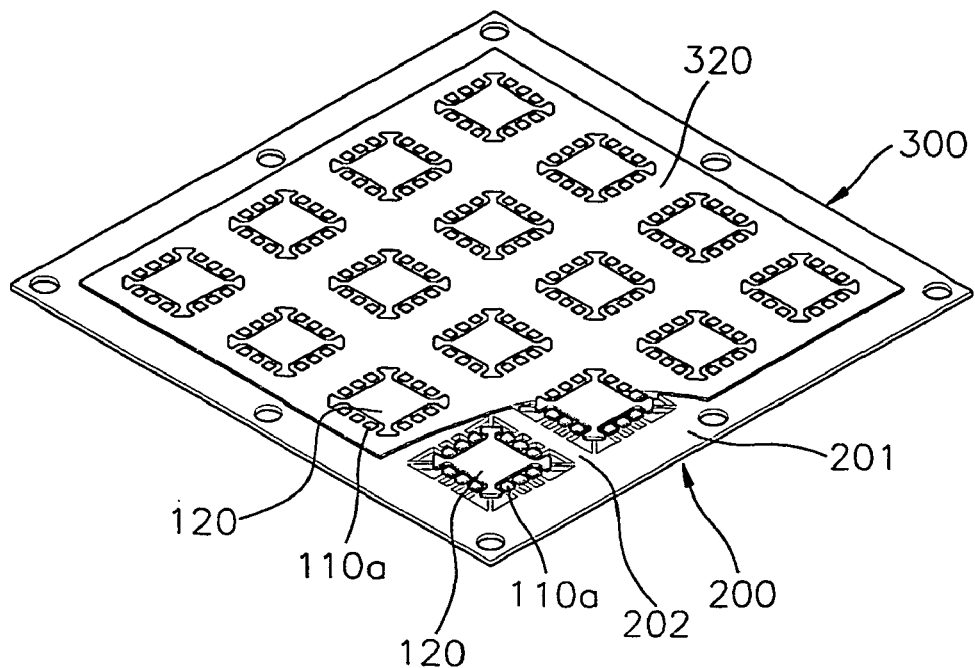
FIG. 15 is a perspective view illustrating the package base of an air cavity type plastic package according to an aspect of a first embodiment of the present invention.

Next, a plastic mold-shaping process is performed on the integrated body of the first and second lead frames 100 and 200, thereby forming a package base 300. FIG. 15 is a perspective view illustrating the package base 300 of an air cavity type plastic package according to an aspect of the first embodiment of the present invention. Referring to FIG. 15, a plastic body 320 is formed to have the same thickness as the integrated body of the first and second lead frames 100 and 200 and covers at least the whole area of the second lead frame 200 so that empty spaces in the integrated body of the first and second lead frames 100 and 200 are filled with the plastic body 320. As a result, the top surfaces of the first leads 110a, the top surface of the first pad 120 and the entire bottom surface of the second lead frame 200 are only exposed on the top and bottom surfaces of the integrated body of the first and second lead frames 100 and 200, filled with the plastic body 320. In FIG. 15, the plastic body 320 is formed such that the top surfaces of the first leads 110a and the top surface of the first pad 120 are level with the top surface of the plastic body 320. If the first lead frame having the first unit body 130d shown in FIG. 10 is used, as shown in FIG. 4, the plastic body 320 is formed such that the top surface of the plastic body 320 is higher than the top surface of the first pad 120.

In forming the plastic body 320, mold flash may spread over the metallic surfaces of the first and second lead frames 100 and 200, which are level with the plastic body 320. However, the mold flash can be easily removed by mechanical polishing like scouring the mold flash off the surfaces of the first and second lead frames 100 and 200.

Next, after mold-shaping the plastic body 320, the metallic surfaces exposed on the surface of the plastic body 320 are plated with a material appropriate for chip 502 bonding, wire 503 bonding, and board mounting, thereby completing the package base 300.

Figure 16:
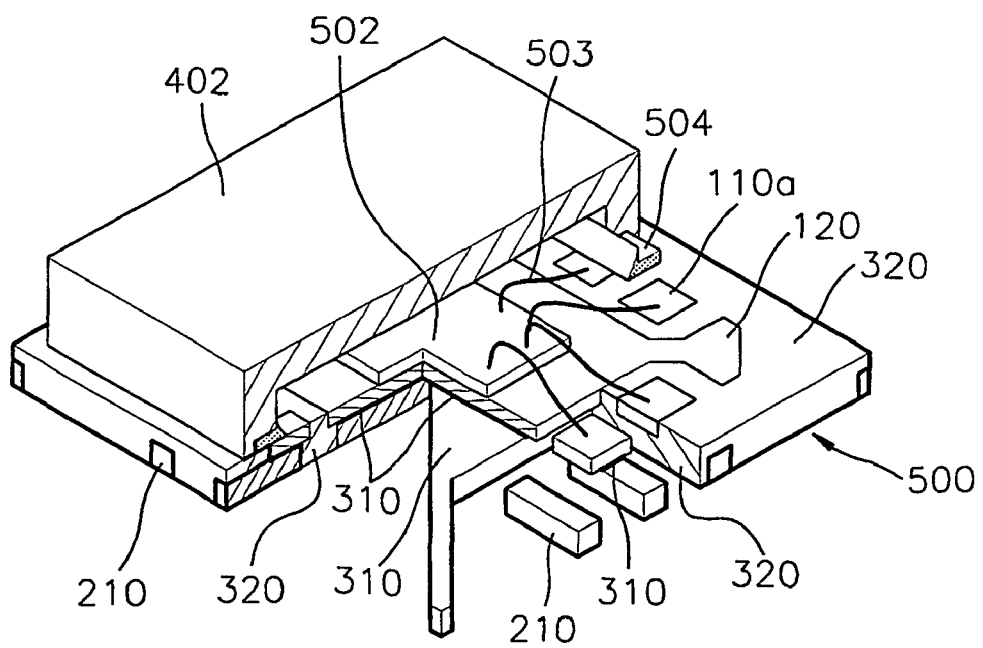
FIG. 16 is a partially sectioned, perspective view illustrating an air cavity type plastic package according to an aspect of a first embodiment of the present invention.

Next, subsequent processes are performed on the package base 300, thereby completing the air cavity type plastic package 500. FIG. 16 is a partially sectioned, perspective view illustrating the air cavity type plastic package according to an aspect of the first embodiment of the present invention. Referring to FIG. 16, a chip bonding process and a wire bonding process are performed on each unit body constituting the package base 300 and then a cover 402 is hermetically installed on each of the unit bodies of the package base 500 with the use of an epoxy adhesive 504. Then, the package base 300 is cut into individual plastic packages and each of the individual plastic packages is a leadless air cavity type plastic package 500 illustrated in FIG. 16.

The formation of the plastic body 320 of the package base 300 may be separately performed on each of the individual plastic packages. In this case, each of the individual packages is a bottom lead type package by cutting the second lead 210.

Figure 17:
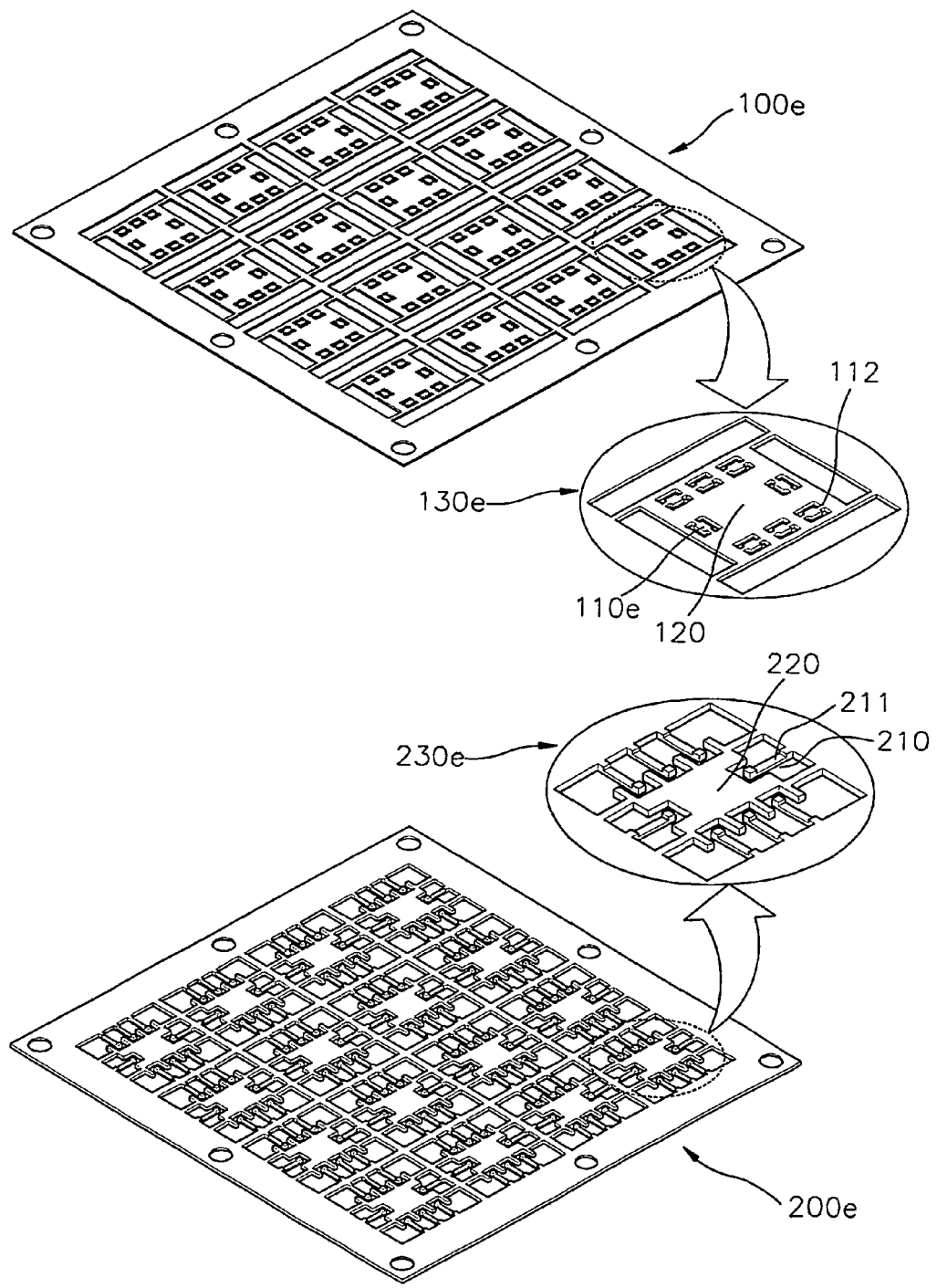
FIG. 17 includes perspective views of first and second lead frames according to another aspect of a first embodiment of the present invention and enlarged views of unit bodies of the first and second lead frames.
Figure 18:
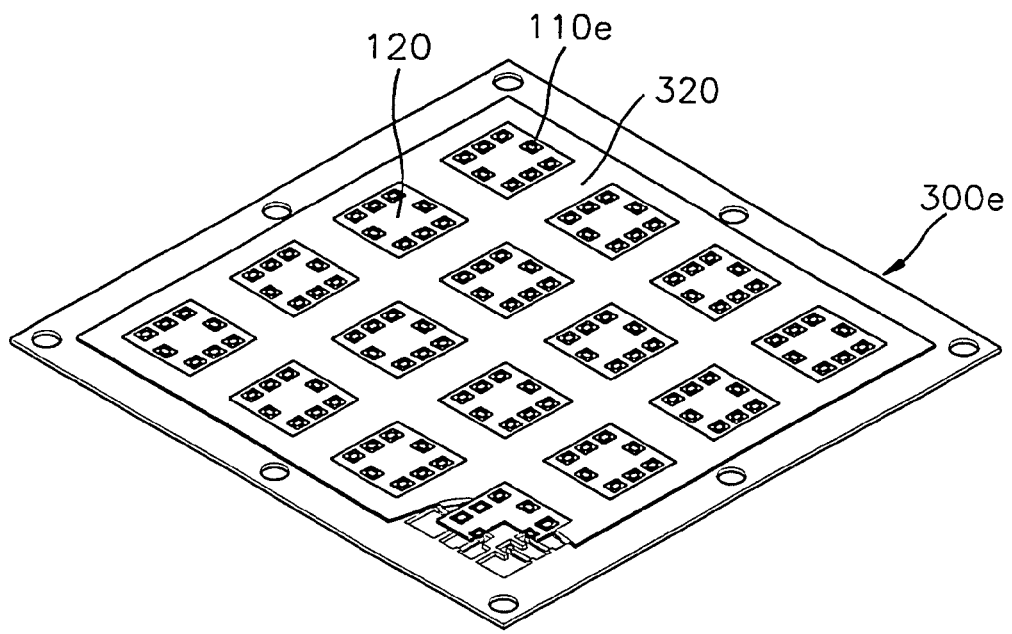
FIG. 18 is a perspective view illustrating the package base of an air cavity type plastic package according to another aspect of a first embodiment of the present invention.
Figure 19:
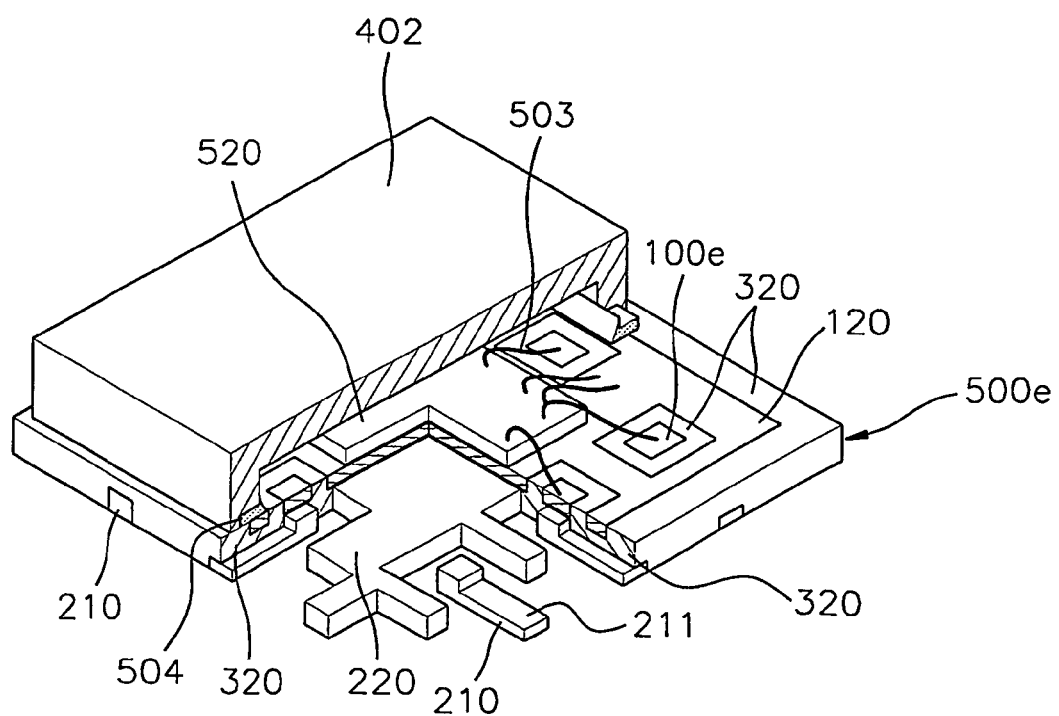
FIG. 19 is a partially sectioned, perspective view illustrating an air cavity type plastic package according to another aspect of a first embodiment of the present invention.

FIG. 17 includes perspective views of first and second lead frames according to another embodiment of the present invention and enlarged views of the unit bodies of the first and second lead frames according to another embodiment of the present invention. FIG. 18 is a perspective view of a package base mold-shaped on a integrated body of the first and second lead frames of FIG. 17. FIG. 19 is a partially sectioned, perspective view of an air cavity type plastic package including the package base of FIG. 18.

Referring to FIGS. 17 through 19, a first lead frame 100e and a second lead frame 200e corresponding to the first lead frame 100e are prepared. In FIG. 17, an enlarged first unit body 130e of the first lead frame 100e and an enlarged second unit body 230e of the second lead frame 200e are illustrated. In the first unit body 130e, first leads 110e are arranged around the first pad 120 and seem to be nearly isolated from the surroundings like an island. In the second unit body 230e, second leads 230e are arranged around the second pad 220. Each of the second leads 230e has a half-etched portion 211 recessed to a predetermined depth. The half-etched portion 211 is formed on the majority of each of the second leads 230e, except the portion contacting the island-like first leads 110e of the first unit body 130e.

As shown in FIG. 18, the plastic body 320 is formed to have the same thickness as the integrated body of the first and second lead frames 100e and 200e and cover at least the whole area of the second lead frame 200e so that empty spaces in the integrated body of the first and second lead frames 100e and 200e are completely filled with the plastic body 320. As a result, the top surfaces of the first leads 110e and the top surface of the first pad 120 and the entire bottom surface of the second lead frame 200e are only exposed on the top and bottom surfaces of the integrated body of the first and second lead frames 100e and 200e filled with the plastic body 320. If the first lead frame having the first unit body 130d shown in FIG. 10 is used, as shown in FIG. 4, the plastic body 320 is formed such that the top surface of the plastic body 320 is higher than the top surface of the first pad 120.

In forming the plastic body 320, mold flash may spread over the metallic surfaces of the first and second lead frames 100e and 200e, which are level with the plastic body 320.

However, the mold flash can be easily removed from the surfaces of the first and second lead frames 100e and 200e by mechanical polishing.

Next, after mold-shaping the plastic body 320, the metallic surfaces exposed on the surface of the plastic body 320 are plated with a material appropriate for chip 502 bonding, wire 503 bonding, and board mounting, such as copper, thereby completing a package base 300e.

Next, subsequent processes are performed on the package base 300e, thereby completing the air cavity type plastic package 500e. FIG. 19 is a partially sectioned, perspective view illustrating an air cavity type plastic package 500e according to another aspect of the first embodiment of the present invention, as described above.

The formation of the plastic body 320 of the package base 300 may be simultaneously performed on the entire integrated body of the first and second lead frames 100e and 200e or may be separately performed on each of the individual plastic packages. Unlike in the present embodiment, an integrated body of first and second lead frames may be formed by depositing three lead frames and attaching them to one another by means of conductive welding flux and removing unnecessary parts from the integrated body of the first and second lead frames by a stamping process.

The air cavity type plastic package according to the present invention may be completed by forming a cover required for forming an air cavity after completing the package base of the present invention and assembling the cover and the package base of the present invention. Alternatively, a plastic package according to the present invention may be completed through one single mold-shaping process after a chip bonding process.

The present invention has several advantages. Firstly, the thickness and area of a metallic heat plate can be increased due to first and second pads, thereby enhancing the thermal resistance of an air cavity type plastic package.

Secondly, it is easy to prevent mold flash from occurring or remove mold flash from the air cavity type plastic package base because the package base has a flat surface structure, thereby simplifying a process for manufacturing the package base required for the air cavity type plastic package, improving productivity, and reducing manufacturing costs.

Thirdly, it is possible to design the air cavity type plastic package to make less noise by enlarging the area facing the edge of the first pad or making the second pad overlay predetermined portions of first leads.

Fourthly, since the plastic package can be made to have a leadless or bottom lead structure, it is possible to reduce an area of a circuit substrate occupied by the air cavity type plastic package.

Finally, since two or more lead frames can be incorporated into one integrated body having predetermined electrical and physical functions as a package, it is possible to easily perform an electrical wiring process, which has been impossible with the use of only one lead frame.

<Second Embodiment>

Figure 5:
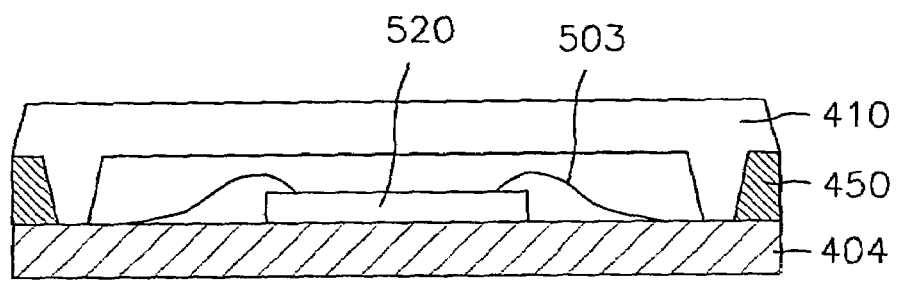
Figure 6:
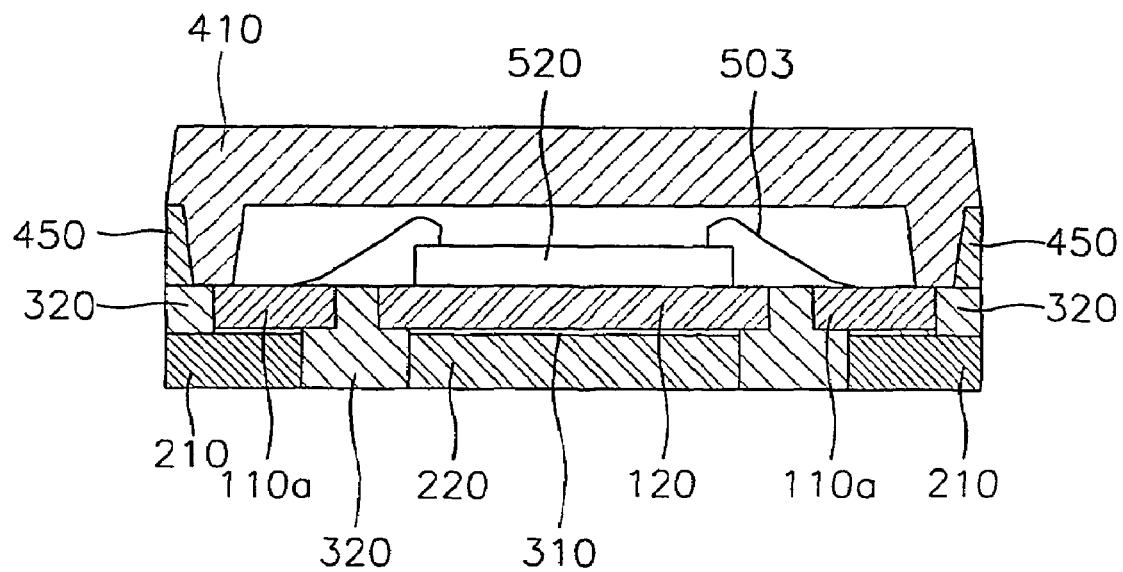
Figure 7:
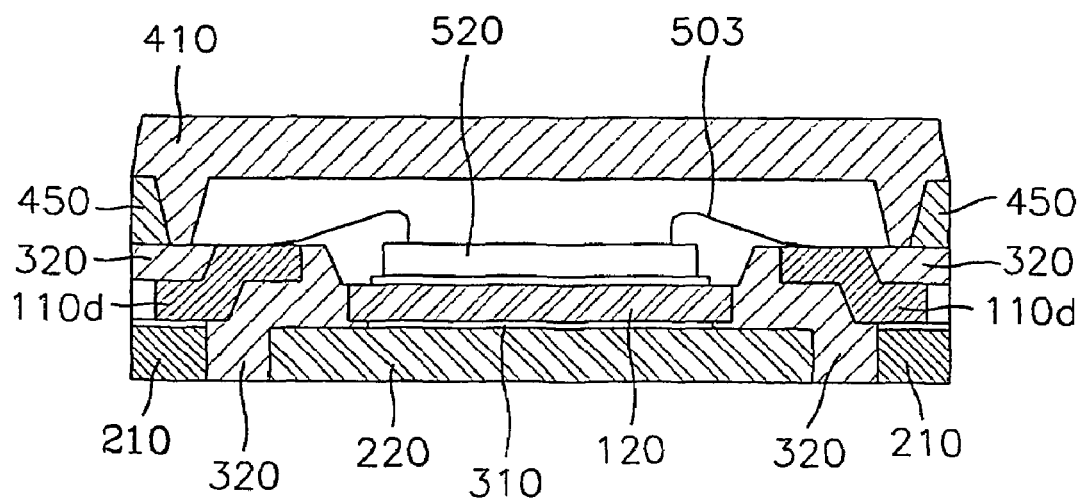

FIGS. 5 through 7 are cross-sectional views illustrating variations of an air cavity type plastic package according to a second embodiment of the present invention. The present invention should not be construed as being limited to air cavity type plastic packages including various package bases shown in FIGS. 5 through 7, but may be applied to other air cavity type plastic packages having different package base structures, which are not illustrated herein.

Referring to FIG. 5, a chip 520 is bonded to a package base 404 by means of an adhesive (not shown), and bonding wires 503 are formed to electrically connect the chip 520 and the package base 404. A plastic cover 410 is hermetically installed on the package base with a sealant 450, thereby forming an air cavity. In FIG. 5, only the major components of the package base 404 are illustrated for the convenience. However, in the package base 404, a plurality of leads (not shown) may be formed to be electrically connected to an external terminal with the bonding wires 503. The package base 404 may be a ceramic or plastic printed circuit substrate.

Referring to FIG. 6, a first lead frame including the first leads 110a, which act as internal terminals, and the first pad 120, and a second lead frame including the second leads 210, which act as external terminals, and the second pad 220, are attached together by means of conductive welding flux 310 so as to overlay each other. The chip 520 is bonded to the first pad 120 of the first lead frame by means of an adhesive (not shown) and is wire-bonded to the first leads 110a of the first lead frame by means of the bonding wires 503.

The first and second lead frames are mold-shaped into an integrated body with an epoxy molding compound (EMC) plastic body 320. The top surfaces of the first leads 110a and the first pad 120 and the bottom surfaces of the second leads 210 and the second pad 220 are exposed. The top surface of the plastic body 320 is level with the top surfaces of the first leads 110a and the first pad 120.

The cover 410 is hermetically bonded to the package base including the first and second lead frames coupled together with the plastic body 320 by interposing an epoxy adhesive 450 between the cover 410 and the package base. As a result, formation of the air cavity type plastic package including the base, the cover 410, and an air cavity formed therebetween is completed.

Referring to FIG. 7, which illustrates an air cavity type plastic package including almost the same package base as illustrated in FIG. 6, predetermined portions of first leads 110d of a first lead frame are bent in the shape of a step, and the top surface of the plastic body 320 is level with the top surfaces of the first leads 110d and is higher than the top surface of the first pad 120. In other words, lower portions of the first leads 110d are bonded to the top surfaces of the second leads 210, and upper portions of the first leads 110d partially overlay the second pad 220 with the plastic body 320 interposed therebetween. In the present embodiment, the cover 410 is hermetically bonded to the package base by means of the epoxy adhesive 450, thereby forming an air cavity.

Hereinafter, a method for manufacturing an air cavity type plastic package according to the second embodiment of the present invention, particularly, air cavity type plastic packages having the structure shown in FIG. 6 will be described more fully with reference to FIGS. 20 through 23. However, this method should not be construed as being limited to only the air cavity type plastic packages described herein but can be equally applied to other variations of air cavity type plastic packages according to the present invention. Since various package bases have been described in detail in the first embodiment of the present invention, their description will not be repeated in the second embodiment. A method for manufacturing an air cavity type plastic package including the package base shown in FIG. 15 is as follows.

Figure 20:
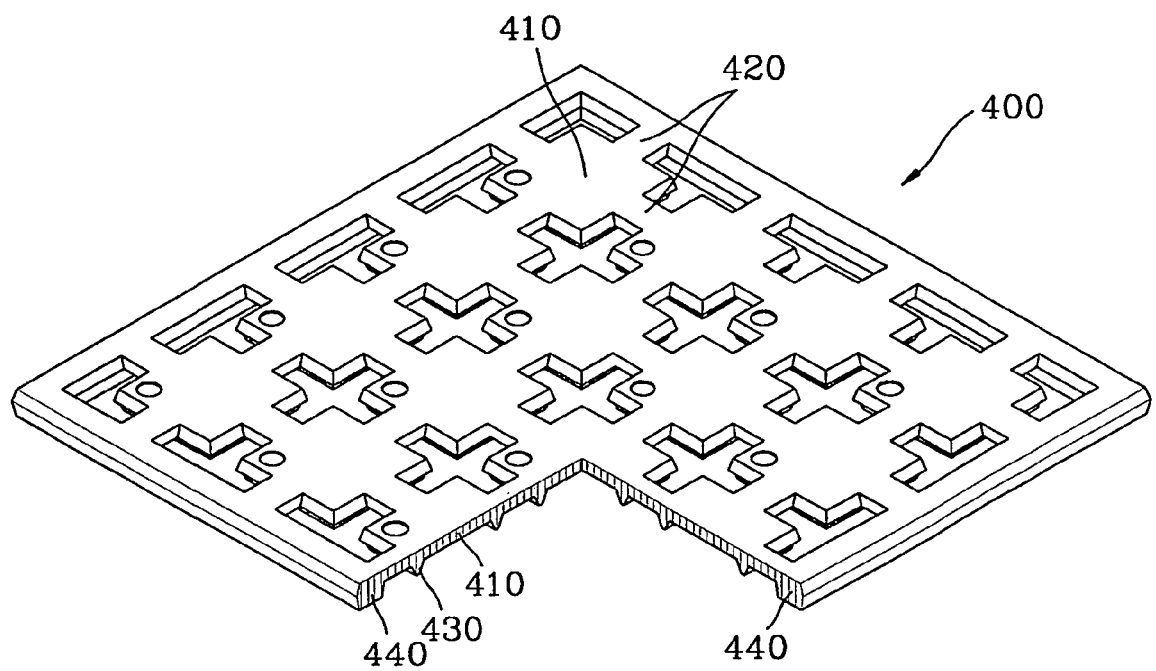
FIG. 20 is a partially sectioned, perspective view illustrating a cover plate of an air cavity type plastic package according to a second embodiment of the present invention.
Figure 21:
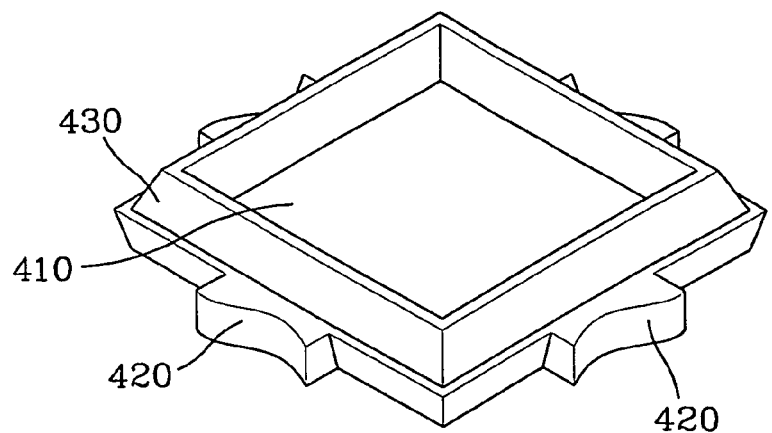
FIG. 21 is a perspective view of the bottom of a unit cover of FIG. 20.

Referring to FIG. 20, a cover plate 400, which is capable of forming an air cavity in a space between the cover plate 400 and each of the unit bodies of the package base 300 after being mounted on the package base 300, is prepared. FIG. 20 is a partially sectioned, perspective view illustrating the cover plate 400, and FIG. 21 is a perspective view illustrating the bottom of one out of a plurality of individual covers arranged on the cover plate 400.

A cover dam 440 is formed along the edge of the cover plate 400 so that the cover plate 400 can adhere closely to the package base 300 and can be fixed to the package base 300. The cover dam 440 can be fit into desired locations of the plastic base 300 with the use of hooks (not shown). An insertion hole (not shown) into which a liquefied epoxy adhesive can be inserted may be further formed at a sidewall of the cover dam 440.

Each of the individual covers includes a covering portion 410 and covering walls 430. The width of each of the covering walls 430 slightly slopes downward from the covering portion 410. Each of the individual covers is connected to the cover dam 440 and adjacent individual covers with connecting portions 420. When the cover plate 400 adheres closely to the package base 300, the connecting portions 420 are spaced a predetermined distance away from the surface of the package base 300 to allow an epoxy to flow through this interval. As a result, all the portions of the cover plate 400 and the package base 300 are incorporated into one body except for an air cavity encapsulated by the covering walls 430, and thus insertion of an epoxy can be uniformly performed through the insertion hole.

Figure 22:
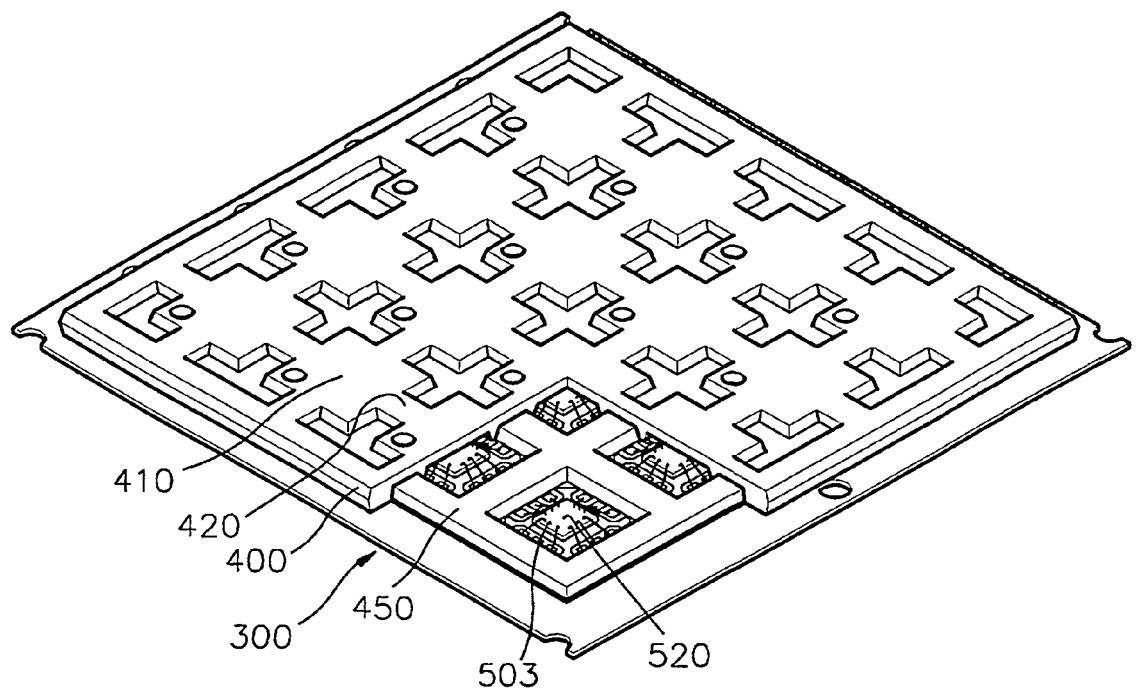
FIG. 22 is a partially sectioned, perspective view illustrating a plastic package according to a first embodiment of the present invention after mounting a cover plate on the package base and inserting an epoxy resin between the cover and the package base.

Next, as shown in FIG. 22, the cover plate 400 adheres closely to the package base 300 to which the chip 520 and the bonding wires 503 are bonded and is fit into the package base 300. Next, the package base 300 on which the cover plate is fixably mounted is placed on a heat plate, the temperature of which can be easily controlled, and then is heated to a predetermined temperature. The predetermined temperature may reach as close as possible below the vitrification transition range of a liquefied epoxy resin to be inserted into spaces between the cover plate 400 and the package base 300 in a subsequent process.

Next, the liquefied epoxy resin is inserted into spaces between the cover plate 400 and the package base 300 through the insertion hole (not shown) and is hardened while continuously maintaining the predetermined temperature.

The reason that the package base 300 and the cover plate 400 are preheated in the present embodiment is that the insertion of the liquefied epoxy resin is preferably performed when the variation range of pressure in the air cavity becomes smallest and thus the pressure of the air cavity is almost without change. In other words, according to the Boyle-Charle's law, as temperature increases in a closed space, the internal pressure of the closed space varies on the assumption that the volume of air in the closed space is maintained at a uniform level. In other words, internal pressure in a closed space varies directly with the increasing temperature of the closed space, and if the temperature of the closed space reaches a predetermined level, the variations of temperature and pressure become sluggish and finally a saturation state is reached. If the cover plate 400 and the package base 300 closely contacting each other are heated before inserting the liquefied epoxy resin therebetween, like in the present embodiment, the density of air in the air cavity gradually decreases and reaches a saturation state, which can be explained in view of the ideal gas equation "PV=nRT" (where P represents pressure, V represents volume, n represents the number of moles of a gas, R represents the ideal gas constant, and T represents temperature). According to the above equation, if the density of air in the air cavity decreases, the degree to which pressure in the air cavity sensitively varies with temperature in the air cavity is mitigated.

If the liquefied epoxy resin is inserted between the package base 300 and the cover plate 400 without preheating the package base 300 and the cover plate 400, and then the package base 300 and the cover plate 400 are heated for hardening the liquefied epoxy resin, the internal pressure in the air cavity hermetically sealed with the liquefied epoxy resin continuously increases. Then, when the internal pressure in the air cavity reaches a predetermined level, the liquefied epoxy, which is not completely hardened yet and thus is still in a fluid state, may seep outside the contact portions between the package base 300 and the cover plate 400, and thus the airtight state of the air cavity may be broken.

On the contrary, if the liquefied epoxy is inserted between the package base 300 and the cover plate 400 after preheating the package base 300 and the cover plate 400 and then is hardened, the air cavity has almost uniform temperature as if under conditions where the liquefied epoxy can hermetically seal the package base 300 and the cover plate 400, in other words, as if the air cavity was in an atmosphere with room temperature and had never been heated. In addition, due to the fact that the density of air in the air cavity is very low, the variation of pressure in the air cavity is less affected by the variation of temperature in the air cavity, and thus the liquefied epoxy can be hardened while stably maintaining the airtight state of the air cavity.

As the area of the air cavity increases, the area of portions to be sealed with the liquefied epoxy decreases, and the viscosity of the liquefied epoxy increases, it becomes easier to maintain the air tight state of the air cavity stably, and thus the above factors must be considered before sealing the package base 300 and the cover plate 400 with the liquefied epoxy.

Figure 23:
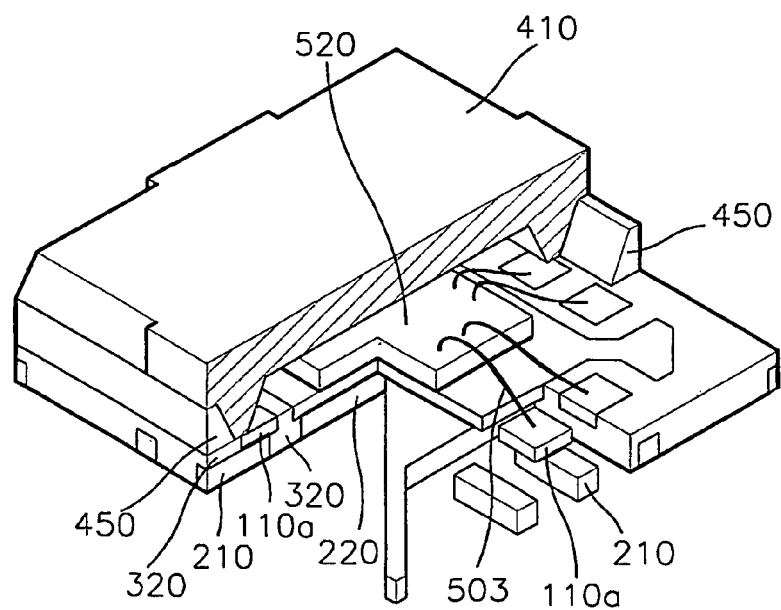
FIG. 23 is a partially sectioned, perspective view illustrating an air cavity type plastic package according to a first embodiment of the present invention.

Next, after the liquefied epoxy is completely hardened and thus the whole process for sealing the plastic package 300 and the cover plate 400 with the liquefied epoxy is over, the connecting portions 420 of each of the individual covers are cut and then the integrated body of the plastic package 300 and the cover plate 400 is divided into individual packages. FIG. 23 is a partially sectioned, perspective view illustrating one of the individual packages.

INDUSTRIAL APPLICABILITY

According to the second embodiment of the present invention, it is possible to form an air cavity type plastic package to have a simple structure and stably maintain the airtight state of an air cavity formed in the air cavity type plastic package.

In addition, it is possible to manufacture an air cavity type plastic package capable of stably maintaining the airtight state of an air cavity formed in the air cavity type plastic package only with the use of a simple heat plate without using an expensive alignment apparatus.

What is claimed is:
1. A method for manufacturing a plastic package base comprising:
    preparing a first lead frame including at least one first unit body comprising a first pad required for chip bonding and first leads acting as internal terminals, arranged around the first pad and spaced a predetermined distance away from the first pad;
    preparing a second lead frame including at least one second unit body comprising a second pad and second leads acting as external terminals and bonded to the first lead frame so that the second pad and the second leads correspond to the first pad and first leads of the first lead frame, respectively;

attaching the first and second lead frames to each other so as to make the first leads and first pad of the first lead frame correspond to the second leads and second pad of the second lead frame, respectively;

completing an integrated body consisting of the first and second lead frames having predetermined electrical and physical functions which a package must have, by removing unnecessary portions of the first lead frame; and forming a plastic body in empty spaces in the integrated body consisting of the first and second lead frames by a mold-shaping process.

2. The method of claim 1, wherein the plastic body exposes the top surfaces of the first leads, the top surface of the first pad, the bottom surfaces of the second leads, and the bottom surface of the second pad, and is formed not to protrude over the top surfaces of the first leads.

3. The method of claim 1, wherein the first lead frame includes a plurality of first unit bodies each comprised of the first leads and the first pad and arranged with section bars for isolating the unit bodies from one another, the first pad of each of the first unit bodies is connected to the section bars or a frame border via a pad connecting portion, and the first leads of each of the first unit bodies are isolated from one another with predetermined spaces formed among the first leads of each of the first unit bodies.

4. A method for manufacturing an air cavity type plastic package comprising:

preparing a package base including a plurality of unit bodies arranged and each comprised of a pad portion required for chip bonding and a lead portion for electrically connecting a chip to the outside;

bonding a chip onto the pad portion of each of the unit bodies;

preparing a cover plate including a plurality of individual covers corresponding to the unit bodies of the package base, covering walls for forming an air cavity with the package base by covering the cavity walls adhere closely to the package base, connecting portions connecting the individual covers to each other and being isolated from the package base by a predetermined distance, and a cover dam formed along the edge of the cover plate for being fit into the package base;

fixing the cover plate to the package base so as to make the covering walls and cover dam of the cover plate protect the chip in each of the unit bodies of the package base;

heating the package base to which the cover plate is fixed to a predetermined temperature;

inserting a liquefied epoxy sealant into spaces between the cover dam and each of the covering walls except for the air cavity in which the chip is installed, while maintaining the package base at the predetermined temperature, and then hardening the liquefied epoxy sealant; and dividing the package base to which the cover plate is fixed into individual packages by the cutting the connecting portions of the package base.

5. The method of claim 4, wherein the step of preparing the package base comprises:

preparing a first lead frame including at least one first unit body comprising a first pad required for chip bonding and first leads acting as internal terminals, arranged around the first pad and spaced a predetermined distance away from the first pad;

preparing a second lead frame including at least one second unit body comprising a second pad and second leads acting as external terminals and bonded to the first lead frame so that the second pad and the second leads correspond to the first pad and first leads of the first lead frame;

attaching the first and second lead frames to each other so as to make the first leads and first pad of the first lead frame correspond to the second leads and second pad of the second lead frame, respectively;

completing an integrated body consisting of the first and second lead frames having predetermined electrical and physical functions which a package must have, by removing unnecessary portions of the first lead frame; and forming a plastic body in empty spaces in the integrated body consisting of the first and second lead frames by a mold-shaping process.

* * * * *